United States Patent [19]

Lin et al.

[11] Patent Number: 4,737,425
[45] Date of Patent: Apr. 12, 1988

[54] PATTERNED RESIST AND PROCESS

[75] Inventors: Burn J. Lin, Scarsdale; Bea-Jane L. Yang; Jer-Mind Yang, both of Yorktown Heights, all of N.Y.

[73] Assignee: International Business Machines Corporation, Armonk, N.Y.

[21] Appl. No.: 872,584

[22] Filed: Jun. 10, 1986

[51] Int. Cl.$^4$ .......................... G03C 3/00; G03C 5/00
[52] U.S. Cl. ........................................ 430/11; 430/15; 430/18; 430/312; 430/322; 430/325; 430/326; 430/394
[58] Field of Search ............... 430/312, 394, 325, 271, 430/326, 311, 328, 11, 14, 15, 18, 322; 156/628

[56] References Cited

U.S. PATENT DOCUMENTS

| | | |
|---|---|---|
| 3,652,274 | 3/1972 | Verest et al. |
| 3,934,057 | 1/1976 | Moreau et al. |
| 3,984,582 | 10/1976 | Feder et al. ............ 430/296 |
| 4,007,047 | 2/1977 | Kaplan et al. |
| 4,125,650 | 11/1978 | Chiu et al. ............ 427/337 |
| 4,180,604 | 12/1979 | Feng et al. ............ 430/270 |
| 4,211,834 | 7/1980 | Lapadula et al. ............ 430/326 |
| 4,289,573 | 9/1981 | Economy et al. ............ 156/643 |
| 4,307,178 | 12/1981 | Kaplan et al. ............ 430/296 |
| 4,373,043 | 2/1983 | Yagi et al. ............ 524/130 |
| 4,396,704 | 8/1983 | Taylor ............ 430/311 |
| 4,426,247 | 1/1984 | Tamamura et al. ............ 156/643 |
| 4,430,153 | 2/1984 | Gleason et al. ............ 156/643 |
| 4,489,200 | 12/1984 | Dziark ............ 528/18 |
| 4,493,855 | 1/1985 | Sachdev et al. ............ 427/41 |
| 4,502,916 | 3/1985 | Umezaki et al. ............ 156/643 |
| 4,521,274 | 6/1985 | Reichmanis et al. ............ 156/643 |
| 4,551,418 | 11/1985 | Hult et al. ............ 430/325 |
| 4,552,833 | 11/1985 | Ito et al. ............ 430/325 |
| 4,596,761 | 6/1986 | Brault ............ 430/296 |
| 4,613,398 | 9/1986 | Chiong et al. ............ 156/628 |

FOREIGN PATENT DOCUMENTS

| | | |
|---|---|---|
| 7719 | 9/1975 | Japan . |
| 129214 | 10/1981 | Japan . |
| 1246704 | 9/1971 | United Kingdom . |
| 1367830 | 9/1974 | United Kingdom . |
| 1520466 | 8/1978 | United Kingdom . |
| 2154330 | 9/1985 | United Kingdom . |

OTHER PUBLICATIONS

Practicing the Novolac Deep-UV Portable Conformable Masking Technique, B. J. Lin et al., J. Vac. Sci. Technol., 19(4), Nov. Dec. 1981, pp. 1313–1319.

A Practical Multilayer Resist Process for $\mu$m Lines, Thomas Batchelder et al., Semiconductor International.

Primary Examiner—John E. Kittle
Assistant Examiner—José C. Dees
Attorney, Agent, or Firm—Pollock, Vande Sande & Priddy

[57] ABSTRACT

A patterned image including on a substrate, a patterned image of a first resist polymeric material and patterned image of a second and different resist material on the first resist polymeric material. The polymeric material contains reactive hydrogen functional groups and/or reactive hydrogen precursor groups. At least the surface layer of the delineated and uncovered first resist polymer material is reacted with a multifunctional organometallic material containing at least two functional groups that are reactive with the functional groups of the polymeric material.

31 Claims, 2 Drawing Sheets

PATTERNED RESIST AND PROCESS

DESCRIPTION

1. Technical Field

The present invention is concerned with providing an image, and is particularly concerned with providing an image or mask of a multi-layer resist article. The present invention is especially concerned with providing what is referred to as photosensitive conformable masks whereby the thermal stability of the bottom layer is improved. In addition, by the present invention, the image patterned can be readily removed from the substrate at that stage of the process when it is desired to do so.

2. Background Art

In the manufacture of patterned devices such as semiconductor chips and carriers, the steps of defining different layers which constitute the desired product are among the most critical and crucial steps involved. Polymer films are often used in integrated circuit fabrication as a pattern transfer mask for the semiconductor substrates. For example, polymers used as a photoresist can act as a mask for etching, ion implantation, or lift-off to induce designated removal, doping, or addition to the underlying substrate, respectively.

As the lines and spaces to be etched, however, become smaller, such as at about 1 micron, the photolithographic procedures for producing the photoresist pattern that is the etch mask and especially the "dry processes" are affected by such parameters as reflections from the surface grain structure of the metals or polysilicon substrate to be etched, standing wave effects, variations in the photosensitive material thickness, reflections from steps and diffraction effects.

One technique for overcoming the problems of surface topology, reflections and diffractions, is to employ a multi-layer resist system known as a portable conformable mask (PCM) system. Such is described by Burn Jeng Lin, "Portable Conformable Mask—A Hybrid Near U.V. and Deep U.V. Patterning Technique", Proceeding of SPIE, Vol. 174, page 114, 1979, disclosure of which is incorporated herein by reference. The simplest multi-layer resist system employs a two-layer resist system which avoids the cost and complexity of most other multi-layer systems. The bottom layer is insensitive to the radiation used to image the top resist layer, and is preferably a resist from a polymer of methylmethacrylate such as polymethylmethacrylate (PMMA), that is applied over the wafer topology to provide a planar surface. The top layer is generally a relatively thin (e.g., about 1 micron or less) layer of a material that is simultaneously sensitive to the imaging radiation—electron beam, X-ray, or optical radiation—and opaque to the radiation used to expose the bottom layer. Typically this can be a positive photosensitive material that responds to the imaging radiation such as ultraviolet light used in step-and-repeat photolithography and is opaque to deep U.V. wavelengths used to expose PMMA. After the top layer is imaged and developed, the bottom layer is imaged by flood exposure through the top layer resist mask and developed using, for instance deep U.V. (about 190 nm to about 280 nm).

Next, the substrate is etched. It is extremely important during pattern transfer processing such as etching the substrate that the integrity of the imaged polymer films be maintained in order to maintain the feasiblility of the process and the linewidth control. The processing temperatures, however, are often as high as about 200° C. or even higher to achieve an acceptable wafer throughput or the proper cleanliness. Most polymers would deform or reflow at such processing temperatures. Hence, many attempts have been made to harden polymers.

For instance, in place of polymethylmethacrylate, it has been suggested to use copolymers of methylmethacrylate, methacrylic acid and methacrylic anhydride to obtain a higher glass transition temperature Tg and higher exposure sensitivity. For instance, see W. Moreau, et al., "Speed Enhancement of PMMA Resist", J. Vac. Sci. Tech., 16 (16), November-December 1979, p. 1989, disclosure of which is incorporated herein by reference. However, the rise in Tg is only to about 150° C. which is still not adequate for many processing conditions in production.

Resists containing a novolak resin and a diazoquinone photoactive compound are hardened by crosslinking with U.V. radiation and/or heat. However, these techniques are only applicable to specific limited classes of materials. Positive resist used as the bottom layer in PCM processes mostly undergo chain-scisson reactions with U.V. radiation and/or heat.

It has also been suggested to incorporate some metallic ion such as $Mg^{+2}$ to produce a more stabile metallic complex or salt. However, incorporating metal ions can affect the sensitivity contrast on residue characteristics of the resist layer. It has also been suggested to create crosslinking by adding in some thermoset resin, e.g., novolak to the scisson predominant resist used as the bottom layer in PCM processes. However, this can cause delineation and sensitivity problems.

Also, by way of background, a number of dry-developable resists have been suggested. For instance, examples of some dry-developable resists are provided in U.S. Pat. Nos. 4,426,247 to Tamamura, et al.; 4,433,044 to Meyer, et al.; 4,357,369 to Kilichowski, et al.; 4,430,153 to Gleason, et al.; 4,307,178 to Kaplan, et al.; 4,389,482 to Bargon, et al.; and 4,396,704 to Taylor. In addition, German patent application No. OS32 15082 (English language counterpart British patent application No. 2097143) suggests a process for obtaining negative tone plasma resist images. Such is concerned with a process involving entrapment of a silicon-containing monomer into a host film at the time of exposure to radiation and requires a processing step to expel the unincorporated silicon monomer from the film before plasma developing of the relief image.

A more recent example of a plasma developable resist is described in U.S. patent application Ser. No. 609,690 (assigned to the assignee of the present application) in which a method is provided for obtaining a resist which is stated to be radiation sensitive and oxygen plasma developable. Such process involves coating a substrate with a film of a polymer that contains a masked reactive functionality; imagewise exposing the film to radiation under conditions that cause unmasking of the reactive functionality in the exposed regions of the film; treating the exposed film with a reactive organometallic reagent; and then developing the relief image by treatment with an oxygen plasma. The specific organometallic reagents described therein are trimethylstannyl chloride, hexamethyldisilazane, and trimethylsilyl chloride. All of these materials are monofunctional.

In addition, a method of obtaining a two-layer resist by top imaging a single layer resist is described in U.S. patent application Ser. No. 679,527 (FI9-84046, assigned to the assignee of the present application) which also employs a monofunctional organometallic reagent. The disclosure of the above two U.S. patent applications are incorporated herein by reference.

SUMMARY OF THE INVENTION

The present invention, provides for improved thermal stability of photoresist material along with overcoming the problems discussed above with respect to various prior suggested techniques. In addition, by following the present invention, the ability to readily remove the patterned resist from the substrate at the stage of the process when it is desired to do so is still maintained.

The present invention is concerned with a patterned image. In particular, the pattern image includes a substrate and a patterned image of a first resist polymeric material on the substrate. The polymeric material contains reactive hydrogen functional groups or reactive hydrogen precursor groups or both. The surface layer of the exposed first polymeric material is reacted with a multifunctional organometallic material containing at least two functional groups that are reactive with the functional groups of the polymeric material. In addition, a patterned image of a second and different resist material can be provided on top of the first resist polymeric material.

The present invention is also concerned with a method for providing an image. The method includes providing a first resist polymeric material on a substrate. The first resist polymeric material contains at least one of reactive hydrogen functional groups or reactive hydrogen precursor groups, or both. A second and different resist material is provided on said first resist polymeric material. The first resist polymeric material is located between the second and different resist material and the substrate.

The second and different resist material is exposed to imaging radiation and developed to thereby provide a resist image mask.

The first resist polymeric material is exposed to imaging radiation through the resist image mask and then developed.

The second resist layer can be retained or removed.

At least the surface layer of the exposed first resist polymeric material is reacted with a multifunctional organometallic material. The organometallic material contains at least two functional groups that are reactive with the functional groups of the polymeric material.

BEST AND VARIOUS MODES FOR CARRYING OUT THE INVENTION

Figure 1:
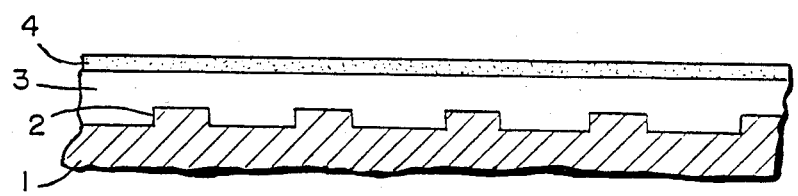
FIGS. 1-4 are cross-sections showing various stages of the fabrication in accordance with the process of the present invention.
Figure 2:
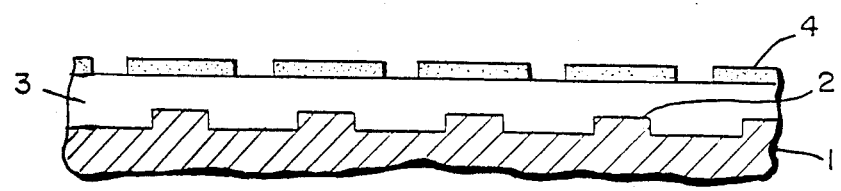

The polymeric materials employed in the present invention for the first resist polymeric material include a number of different types of materials provided such contain reactive hydrogen functional groups and/or groups which act as precursors to reactive hydrogen functional groups. For instance, the polymeric material can contain moieties which are labile such that upon subjection to certain conditions, such as irradiation, will produce reactive hydrogen functional groups. As used herein, "hydrogen functional groups" includes normal hydrogen function groups, as well as its isomer; deuterium functional groups with normal hydrogen being preferred.

Examples of some reactive hydrogen functional groups include OH, COOH, NH, and SH groups. Also, epoxide groups which are capable of undergoing ring opening and forming OH groups are suitable reactive hydrogen functional precursor groups.

Examples of some polymers containing hydrogen functional groups include polyvinylpyrrolidone, polyvinylalcohol, polymers of p-hydroxystyrene, melamino polymers, homopolymers and copolymers of monoethylenically unsaturated acids, copolymers of alkyl methacrylates containing about 1-4 carbon atoms in the alkyl group, and a monoethylenically unsaturated acid. The monoethylenically unsaturated acid can be acrylic acid, methacrylic acid, or crotonic acid. Usually, the polymer contains from about 50 to about 99.5 mole percent of the alkyl methacrylate and about 50 to about 0.5 mole percent of the unsaturated acid. These mole percents are based upon the total moles of the alkyl methacrylate and acid in the polymer. Examples of such polymer can be found in U.S. Pat. No. 3,984,582, disclosure of which is incorporated herein by reference.

In addition, such copolymers of alkyl methacrylates can contain an anhydride of the unsaturated acid. A particular polymer being a terpolymer of methylmethacrylate, methacrylic acid, and methacrylic anhydride.

Examples of other polymers having reactive hydrogen functional groups include prepolymerized phenol formaldehyde polymers which can be prepared by the acid or base catalyzed condensation of formaldehyde with an excess of a phenol having the formula:

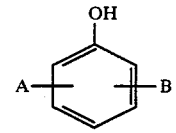

wherein A and B, individually, are hydrogen or alkyl group containing 1-6 carbon atoms. Such phenolic formaldehyde polymers are referred to as novolak polymers. In addition, such phenol novolak compositions can contain a diazo ketone sensitizer as known in the art. Such sensitizers and polymers are described, for example, in U.S. Pat. Nos. 3,046,118; 3,046,121; 3,106,465; 3,201,239; and 3,666,473; disclosure of which are incorporated herein by reference. The sensitizers are diazo ketones having diazo and keto group at adjacent positions on the molecules, such as the naphthoquinone-(1,2)-diazide sulfonic acid esters which are reported in U.S. Pat. No. 3,201,239 which has the formula:

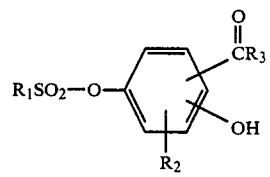

in which $R_1$ is a naphthoquinone-(1,2)-diazide radical, $R_2$ is selected from the group of hydrogen and hydroxyl, and $R_3$ is from the group of hydrogen, alkyl, aryl, alkoxy, aryloxy, amino, and heterocyclic groups.

Examples of sensitizers are also reported in U.S. Pat. No. 3,046,118 which has the formula:

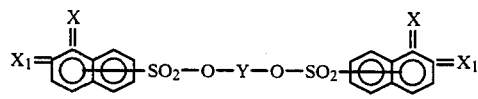

wherein X and $X_1$ are $N_2$ or O, those attached to the same ring being different, and Y is an organic linkage containing at least one arylene, substituted arylene, or heterocyclic radical; U.S. Pat. No. 3,046,121 which has the formula:

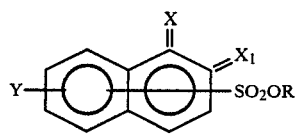

wherein X and $X_1$ are from the group of $N_2$ and O and are different. Y is hydrogen or halogen and R is a substituted or unsubstituted aryl or heterocyclic radical; and U.S. Pat. No. 3,106,465 which has one of the formula:

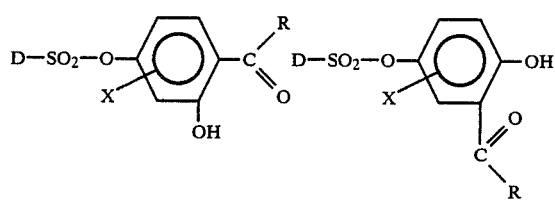

wherein D stands for naphthoquinone-(1,2)-diazide radical; X stands for H or OH; R stands for a member of the group of hydrogen, $OR_1$, $NR_2R_3$, alkyl-, aryl-, and heterocyclic radicals; $R_1$ is an alkyl or aryl; $R_2$ and $R_3$ are a hydrogen alkyl or aryl, $R_2$ equaling $R_3$ or being different from $R_3$.

Examples of such compounds are 2,3,4-trihydroxybenzophenone esters of 1-oxo-2-naphthalene-5 sulfonic acid. The sensitizers, when used, are generally employed in amounts of about 12% to about 30% by weight of the polymeric components of the composition.

Polymers containing labile groups which are capable upon excitation, such as upon irradiation of generating reactive hydrogen groups include O-nitrobenzene derivatives and polymers capable of photo-fries rearrangement. Upon irradiation, acids, alcohols, and/or amines with reactive hydrogens are generated. Examples of such materials are:

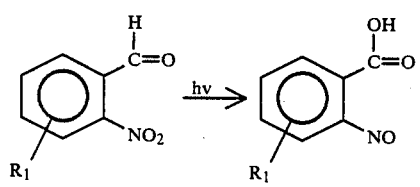

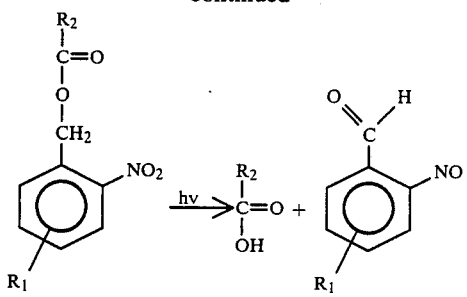

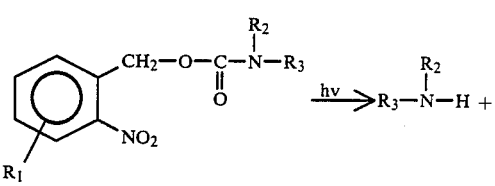

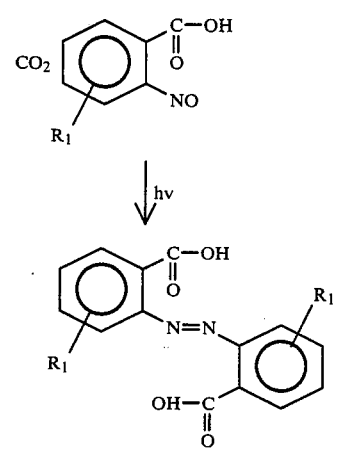

wherein $R_1$, $R_2$, $R_3$, and $R_5$=H, alkyl, aryl, or part of a polymer backbone and $R_4$=H, $C_nH_{2n+1}$ wherein n ranges from 1 to about 5 phenyl or substituted phenyls.

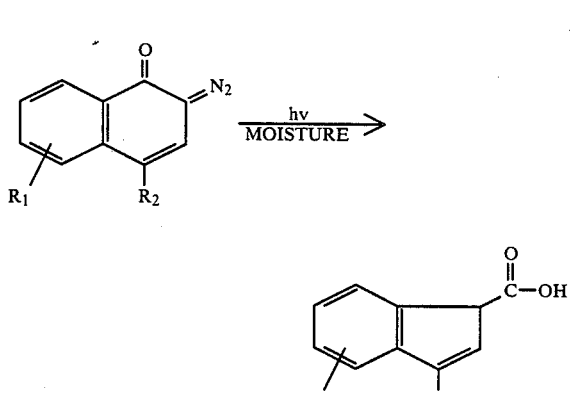

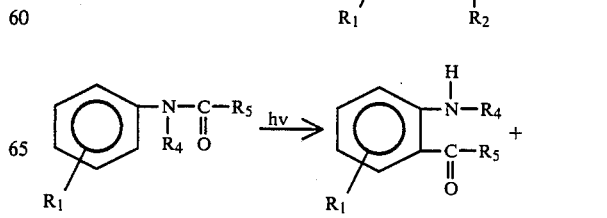

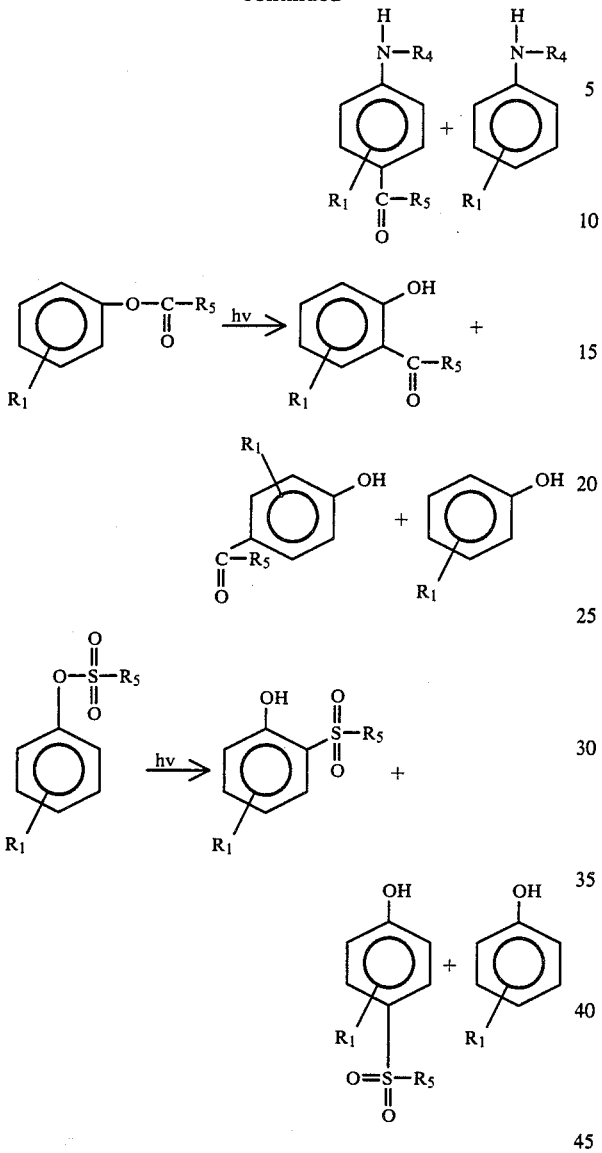

wherein $R_1$, $R_2$, $R_3$, and $R_5$=H, alkyl, aryl, or part of a polymer backbone and $R_4$=H, $C_nH_{2n+1}$ wherein n ranges from 1 to about 5 phenyl or substituted phenyls.

Materials of the above type can be used alone or in combination with compatible polymeric materials. Compounds such as substituted O-nitrobenzaldehyde, esterified phenols, and diazoquinone derivatives can be mixed together with polymers which have no labile or reactive hydrogens. For example, polymethylmethacrylate, styrene-butadiene rubbers, polymethylisopropenyl ketone (PMIPK), and polystyrene and its derivatives. Upon irradiation, the molecules which are sensitive to the irradiation undergo rearrangement to yield products with labile and reactive hydrogens. The labile and reactive hydrogens are then subsequently reacted with an organometallic reagent pursuant to the process of the present invention.

Examples of such particular polymers include acetylated polyvinylphenol, poly (p-formyl) oxystyrene, copolymers prepared from p-formyl oxystyrene, poly (t-butyl) methacrylate, poly (t-butyloxycarbonyloxystyrene), and copolymers from t-butylmethacrylate or t-butyloxycarbonyl-oxystyrene. Disclosures of such polymers can be found in U.S. patent application Ser. No. 679,527, U.S. patent application Ser. No. 609,690, and U.S. patent application Ser. No. 713,370 (Docket FI984055) to Hefferon, et al. filed on Mar. 19, 1985 and entitled "Method of Creating Patterned Multilayer Films for Use in Production of Semiconductor Circuits and Systems", disclosures of which are incorporated herein by reference.

The multifunctional organometallic material employed pursuant to the present invention must contain or be capable of supplying at least two functional groups which are reactive with the reactive groups of the polymeric material. Examples of suitable metallic portions of the organometallic material are Group III A metals, Group IV A metals, Group IV B metals, and Group VI B metals. Examples of Group IV A metals are tin, germanium, and silicon. Examples of Group IV B metals are titanium and zirconium. Examples of Group VI B metals are tungsten and molybdenum. An example of a Group III A metal is aluminum. The preferred metallic portions are titanium, silicon, and tin with the most preferred being silicon.

The reactive groups of the organometallic compound include such reactive groups as hydroxy, amino, mercapto, and halogen; and groups capable of supplying reactive groups include alkoxy groups such as methoxy and ethoxy which hydrolyze to form OH groups.

Examples of suitable organometallic compounds include the following:

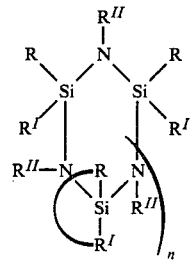

1.

wherein each R and $R^I$, individually, is H, alkyl, cycloalkyl, aryl, halo-substituted alkyl, halo, or halo-substituted aryl; each $R^{II}$, individually is H, alkyl, or aryl; and n is a whole number integer $\geq 1$ and preferably 1 or 2.

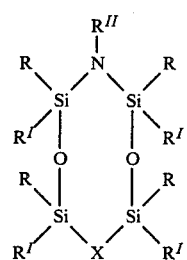

2.

wherein each R and $R^I$, individually is H, alkyl, cycloalkyl, aryl, halo, halo-substituted alkyl, or halo-substituted aryl; each $R^{II}$, individually, is H, alkyl, or aryl; and X is O, Si, or N—R''.

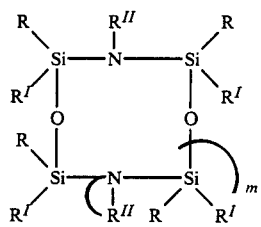

wherein each R and $R^I$, individually, is H, alkyl, cycloalkyl, aryl, halo, halo-substituted alkyl, or halo-substituted aryl; each $R^{II}$, individually, is H, alkyl, or aryl; and m is a whole number integer $\geq 1$ and preferably 1 or 2.

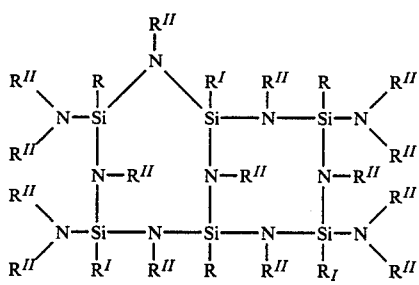

wherein each R and $R^I$, individually, is H, alkyl, cycloalkyl, aryl, halo, halo-substituted alkyl, or halo-substituted aryl; and each $R^{II}$, individually, is H, alkyl, or aryl.

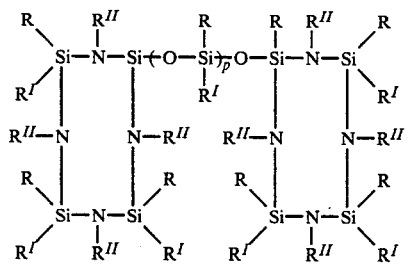

wherein each R and $R^I$, individually, is H, alkyl, cycloalkyl, aryl, halo, halo-substituted alkyl, or halo-substituted aryl; each $R^{II}$, individually, is H, alkyl, or aryl; and p is a whole number integer of $\geq 1$ and preferably 1–4.

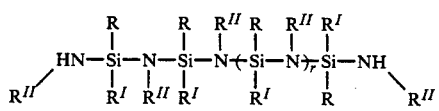

wherein each R and $R^I$, individually, is H, alkyl, cycloalkyl, aryl, halo, halo-substituted alkyl, or halo-substituted aryl; each $R^{II}$, individually, is H, alkyl, or aryl; and r is a whole number integer of 0–$10^2$, preferably 1–4.

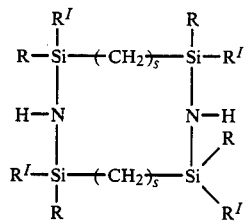

wherein each R and RI, individually, is H, alkyl, cycloalkyl, aryl, halo, halo-substituted alkyl, or halo-substituted aryl; and each s, individually, is whole number integer $\geq 1$, and preferably 1 or 2.

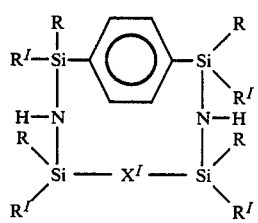

wherein each R and $R^I$, individually, is H, alkyl, cycloalkyl, aryl, halo-substituted alkyl, halo-substituted aryl, or halo; and $X^I$ is $(-CH_2-)_{t'}$ or

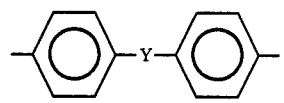

wherein t is a whole number integer of $\geq 1$ and preferably 1–4; and Y is O, NH, or S.

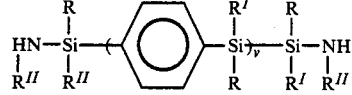

wherein each R and $R^I$, individually, is H, alkyl, cycloalkyl, aryl, halo, halo-substiututed alkyl, or halo-substituted aryl; and v is a whole number integer of $\geq 1$ and preferably 1–4.

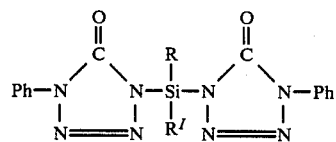

wherein each R and $R^I$, individually, is H, alkyl, cycloalkyl, aryl, halo-substituted alkyl, or halo-substituted aryl.

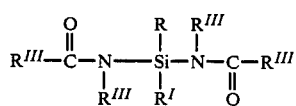

wherein each R and $R^I$, individually, is H, alkyl, cycloalkyl, aryl, halo, halo-substituted alkyl, or halo-substituted aryl, and each $R^{III}$, individually, is alkyl.

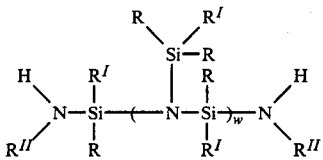

12.

wherein each R and $R^I$, individually, is H, alkyl, cycloalkyl, aryl, halo, halo-substituted alkyl, or halo-substituted aryl; each $R^{II}$, individually, is H, alkyl, or aryl; and w is a whole number integer $\geq 1$ and preferably 1–4.

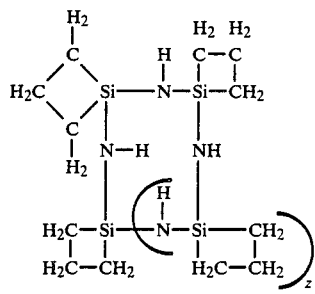

13.

wherein z is a whole number integer of 0–4 and preferably 0–2.

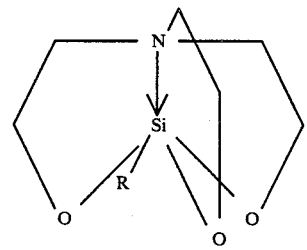

14.

wherein R is H, alkyl, cycloalkyl, aryl, halo, halo-substituted alkyl, or halo-substituted aryl.

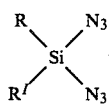

15.

wherein each R and $R^I$, individually, is H, alkyl, cycloalkyl, aryl, halo, halo-substituted alkyl, or halo-substituted aryl.

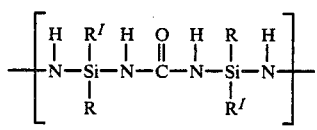

16.

wherein each R and $R^I$ is H, alkyl, aryl, cycloalkyl, halo, halo-substituted alkyl, or halo-substituted aryl; and a is a whole number integer $\geq 1$ and preferably 1–4.

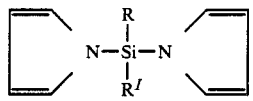

17.

wherein R and $R^I$, individually, is H, alkyl, cycloalkyl, aryl, halo, halo-substituted alkyl, or halo-substituted aryl.

18.

$$Y^I-\underset{\underset{R}{|}}{\overset{\overset{R^I}{|}}{Si}}-Y^I$$

wherein each $Y^I$, individually, is

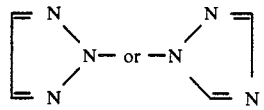

and $R^I$ and R, individually, is H, alkyl, aryl, cycloalkyl, halo, halo-substituted alkyl, or halo-substituted aryl.

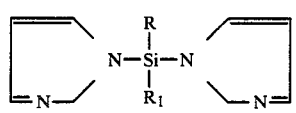

19.

wherein R and $R^I$, individually, is H, alkyl, cycloalkyl, aryl, halo, halo-substituted alkyl, or halo-substituted aryl.

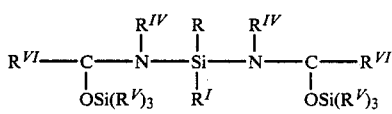

20.

wherein R and $R^I$, individually, is H, alkyl, aryl, cycloalkyl, halo, halo-substituted alkyl, or halo-substituted aryl; each $R^{IV}$, individually, is H or alkyl; each $R^V$, individually, is H or alkyl; and each $R^{VI}$, individually, is alkyl or $CX_3$ (X=R, Cl, Br, I).

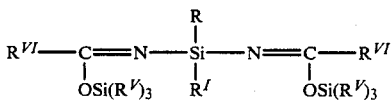

21.

wherein R and $R^I$, individually, is H, alkyl, aryl, cycloalkyl, halo, halo-substituted alkyl, or halo-substituted aryl; each $R^{IV}$, each $R^V$, individually, is H or alkyl; and each $RV^I$, individually, is alkyl or $CX_3$ (X=F, Cl, Br, I).

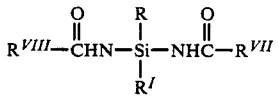

22.

wherein R and $R^I$, individually, is H, alkyl, aryl, cycloalkyl, halo, halo-substituted alkyl, or halo-substituted aryl; and each $R^{VII}$, individually, is alkyl.

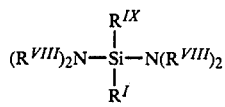
23.

wherein each $R^{IX}$, individually, is alkyl; and each $R^{VIII}$, individually, is alkyl.

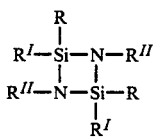
24.

wherein each R and $R^I$, individually, is H, alkyl, cycloalkyl, aryl, halo-substituted alkyl, halo or halo-substituted aryl; each $R^{II}$, individually, is H, alkyl, or aryl.

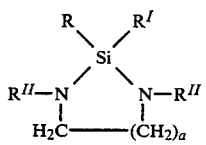
25.

and dimers and polymers thereof wherein each R and $R^I$, individually, is H, alkyl, cycloalkyl, aryl, halo-substituted alkyl, halo, or halo-substituted aryl; each $R^{II}$, individually, is H, alkyl or aryl; and a is 1, 2, or 3.

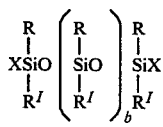
26.

wherein b is a whole number integer of 1–5; each R and $R^I$, individually, is H, alkyl, cycloalkyl, aryl, halo-substituted alkyl, halo, or halo-substituted aryl; each x, individually, is halo, SH, OH, $OR^x$, and NH and $R^x$ is alkyl, 1–5 carbon atoms, and preferably ethyl or methyl.

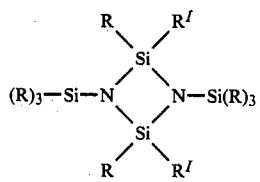
27.

wherein each R and $R^I$, individually, is H, alkyl, cycloalkyl, aryl, halo-substituted alkyl, halo, or halo-substituted aryl.

Examples of suitable alkyl groups in the above formulas are alkyl groups containing 1–12 carbon atoms and preferably 1–4 carbon atoms. Specific examples of such are methyl, ethyl, propyl, butyl, and octyl. The most preferred alkyl groups are methyl and ethyl.

Examples of suitable cycloalkyl groups are cyclohexyl and cycloheptyl.

Examples of suitable aryl groups are phenyl, tolyl, xylyl, and napthyl radicals.

Examples of suitable halo radicals are F, Cl, Br, and I.

Examples of suitable halo-substituted alkyl groups are 1,1,1-trifluoropropyl and chloromethyl.

Examples of suitable halo-substituted aryl groups are chlorophenyl and dibromophenyl.

Examples of some specific organometallic compounds are 3-aminopropyltriethoxy silane, commercially available from Union Carbide under the trade designation A 1100; gamma-aminopropyl-trimethoxy silane; hexamethylcyclotrisilizane; octamethyl-cyclotetrasilizane; 1,3-dichlorodimethyldiphenyl disilizane; 1,7-dichlorooctamethyl tetrasilizane; N-methylaminopropyl trimethyoxysilane; 3-aminopropyl methyl diethoxy silane; 1,3-divinyl tetraethoxy disiloxane; N-2-aminoethyl-3-aminopropyl trimethoxy silane; 1,3-bis-(gammaaminopropyl tetramethyl disiloxane); tetraethoxy titanium; and tetrabutoxytitanium.

The amount of the organometallic material employed must be sufficient to provide the desired degree of crosslinking and hardening.

The organometallic material is reacted with the first resist polymeric material after the polymeric material has been exposed and developed to form the desired preselected pattern. The reaction is carried out so that at least the surface layer of that portion of the resist that is exposed or uncovered and not covered by the second resist material on top and the substrate on the bottom, (e.g.—the uncovered side walls of the polymeric material) is reacted. It is preferred that the polymeric material not be reacted all of the way through and most preferably, only up to about 50% so as to facilitate removal of reacted material when it is desired to do so in the process. Usually, about 100 to about 2000 angstroms and more usually about 200 to about 1000 angstroms of the surface layer thickness is reacted.

The reaction with the organometallic material significantly enhances the thermal stability of the layer.

The patterned image of the present invention can be subjected to temperatures above about 200° C. without distortion. Moreover, the reacted layer can be readily removed from the substrate when it is desired to do so in the process.

The multifunctional organometallic material can be in either the vapor phase or liquid phase including the organometallic material as a liquid per se or dissolved in a suitable solvent when reacted with the polymeric material.

The patterned layer of the first resist polymeric material is usually about 1 to 4 microns thick and more usually about 2 to about 3 microns thick.

The first resist polymeric material can be applied to the substrate such as by spraying, spinning, dipping, or any other known means of application.

Some suitable substrates include those used in the fabrication of semiconductor devices or integrated circuits which include wafers or chips overcoated with oxides and nitrides (silicon oxide and/or silicon nitride for diffusion masks and passivation) and/or metals normally employed in the metallization steps for forming contacts and conductor patterns on the semiconductor chip.

If desired, the organometallic material can be dissolved in an organic solvent which is non-reactive with the organometallic material. Usually, the inert organic solvent is aprotic. Examples of some solvents are the aromatic hydrocarbons and substituted aromatic hydrocarbons including benzene, toluene, xylene, and chlorobenzene. Other solvents include N-methyl pyrrolidone; γ-butyrolactone; acetates, such as butyl acetate and 2-methoxy acetate; ethers; and tetrahydrofuran. In addition, the solvent can be selected so that it has some ability to diffuse enough through the polymeric material to provide the needed contact between the organometallic material and polymeric material. However, this solvent should be only a partial rather than a good solvent for the polymeric material. Accordingly, the choice of the polymeric material will have some effect upon the choice of the solvent used for best results.

The solvent component also can include a solvent in which the polymeric material is readily soluble when the major portion of the solvent component is a non-solvent or only a partial solvent for the polymeric material. The solvent for the polymeric material can be employed in amounts effective to decrease the necessary reaction time between the multifunctional organometallic material and the polymeric material. The solvent for the polymeric material must be non-reactive with the multifunctional organometallic material. Examples of suitable solvents for the polymeric material to be employed are N-methyl pyrrolidone, γ-butyrolactone, and acetates such as cellosolve acetate, butyl acetate, and 2-methoxy ethyl acetate.

The solvent for the polymeric material, when employed, is in relatively minor amounts so as not to remove or dissolve the polymeric film. Usual amounts of the organic solvent for the polymeric material are about 0.01% to about 25% by volume and more usually about 0.25% to about 5% based on the total amount of organic solvent in the liquid composition. The total amount of solvent in the liquid composition is usually about 75% to about 98% and preferably about 95% to about 96% based upon the total of the solvent and organometallic material in the liquid composition. Use of elevated temperatures also enhances the diffusion through the polymeric material.

The reaction between the organometallic material and polymeric material is usually carried out in about 5 minutes to about 1.5 hours and more usually about 20 to about 80 minutes, 40 minutes of which is typical.

The second and different resist material employed differs from the layer of the first resist polymeric material in that it is sensitive to imaging radiation to which the first resist polymeric material has only limited sensitivity.

The layer of the second resist material employed in accordance with the present invention is preferably a material which, upon exposure to wavelengths in the mid and near U.V. range, such as about 300 nanometers to about 350 nanometers and 350 nanometers to about 450 nanometers, respectively, can be developed. The dosage of U.V. radiation of wavelength of about 300 to about 350 nanometers is about $20 \times 10^{-3}$ to about $150 \times 10^{-3}$ joule/cm$^2$. The dosae of U.V. radiation of wavelengths of about 360 to about 450 nanometers is about $20 \times 10^{-3}$ to about $100 \times 10^{-3}$ joule/cm$^2$. The second resist material can be crosslinked after development by deep U.V. radiation. Examples of discussions of the use of deep U.V. radiation to harden, cure, or crosslink resist used as the second resist material can be found in Yen, et al., *Deep U.V. and Plasma Hardening of Photoresist Patterns,* Integrated Circuit Laboratory, Xerox, Palo Alto Research Center, Palo Alto, Calif.; Hiraoaka, et al., *High Temperature Flow Resistance of Micron Sized Images in AZ Resists,* AZ Resists, Volume 128, Number 12, pages 2645-2647; and Ma, *Plasma Resist Image Stabilization Technique (PRIST) Update,* Volume 333, Submicron Lithography, 1982, pages 1-23, disclosures of which are incorporated herein by reference. Both positive and negative photoresist can be used for the second resist material.

Among those photosensitive materials found to be especially suitable are the positive photosensitive materials which are crosslinkable when exposed to U.V. radiation of 260 nm and above, and particularly those photosensitive materials sensitized with diazo compounds. Examples of such diazo sensitizers are discussed on pages 48-55 of DeForest, *Photoresist Materials and Processes,* McGraw-Hill Book Company, 1975, disclosure of which is incorporated herein by reference. Some diazo compounds are derivatives of benzoquinone 1, 2-diazide-4-sulphochloride; 2-diazo-1-napthol-5-sulphonic acid ester; napthoquinone-1, 2-diazide-4 sulphochloride; napthoquinone-2-1-diazide-4-sulphochloride; and napthoquinone 2, 1-diazide-5-sulphochloride. Suitable sensitizers for negative resists are the arylbisazides.

The preferred photosensitive materials employed as the second layer are the phenolic formaldehyde type novolak type polymers sensitized with a diazo compound. The phenols include phenol and substituted phenols such as cresol. A particular example of such is Shipley AZ1350 which is an cresol-formaldehyde novolak polymer composition. Such a positive resist composition includes therein a diazoketone such as 2-diazo-1-napthol-sulphonic ester. The composition usually contains on the order of about 15% to about 30% and more usually about 17% to about 25% weight or so of the diazoketone compound. Examples of some other commercially available photosensitive materials suitable for providing the second layer of material employed in accordance with the present invention are AZ1370 and AZ1470 from Shipley; AZ4110 and AZ4210 from AZ Photoresistive Division of American Hoechst; HPR 204 from Phillip A. Hunt; Kodak 820 from Kodak, and OFPR 800 from Tokyo Ohka.

In addition, discussion of various photosensitive materials can be found, for instance, in the *Journal of the Electrochemical Society,* Volume 125, Number 3, March 1980, Deckert, et al., "Microlithograph—Key to Solid-State Fabrication", pages 45C-56C, disclosure of which is incorporated herein by reference.

The second or top resist layer is usually about 0.5 to about 2 microns thick, typical of which is about 1 micron.

Reference to FIGS. 1-4 further illustrates the present invention. FIG. 1 illustrates a substrate 1 containing steps or profile 2.

On top of substrate (1) is provided a layer (3) of a resist polymeric material having reaction hydrogen functional groups, or reactive hydrogen precursor groups, or both for planarization. A layer of a second and different resist material (4) is provided on top of layer (3). The top layer (4) is exposed to imaging radiation and then developed to provide the structure shown in FIG. 2. If desired, the layer (4) can be hardened such as by molding or capping technique whereby a layer of polymethylmethacrylate (not shown) is applied over the imaged layer (4) by, for example, spin casting. The polymethylmethacrylate covers the imaged layer (4) forming a mold on it. The thickness of the polymethylmethacrylate layer is about twice that of the layer (4). The composite is then subjected to a hardening bake between about 180° C. and about 220° C. Normally, novolak type images subjected to such a baking temperature would reflow. In this arrangement, however, the polymethylmethacrylate layer forms a mold to hold the novolak layer (4) in place until it is thermally crosslinked thoroughly.

Figure 3:
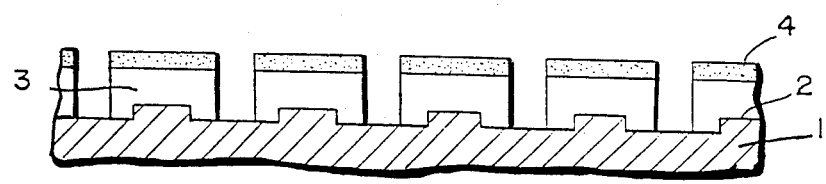
Figure 4:
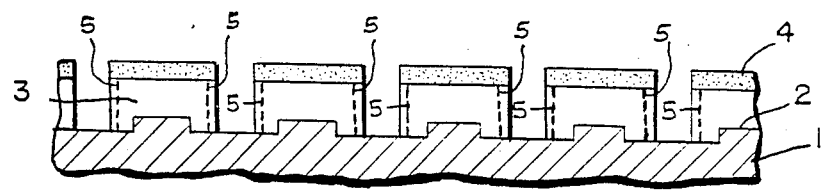

The first resist polymeric material (3) is subjected to imaging radiation through the image mask created from layer (4) and then developed to provide the pattern shown in FIG. 3. The imaging radiation and development step also removes the polymethylmethacrylate (not shown) covering layer (4). The first resist polymeric material can be exposed for imaging to deep U.V. radiation such as about 190 to about 280 nanometers. The exposed portion of layer (3) can be developed, for instance, by a mixture of methyl ethyl ketone and methyl isobutyl ketone in a 1:4 ratio and 1% water.

Next, the surface layer (e.g.—about 100 to about 2000 angstroms thick) of the uncovered portions of patterned layer (3) is reacted with the organometallic compound. The reacted portion is represented by numeral 5 in FIG. 4.

After the layer (3) has served as a mask for its desired purpose, it can be readily removed from the substrate, lifting off with it the overlying patterned layer (4). Layer (3) can be removed, for instance, by dissolving in a suitable solvent such as N-methyl pyrrolidone at room temperature to about 120° C. Layer (3) could also be removed by using a plasma etch of about 1% to about 5% $CF_4$ by volume in oxygen.

The following non-limiting examples are presented to further illustrate the present invention.

EXAMPLE 1

A solution of a terpolymer of about 70% of methylmethacrylate, about 15% of methacrylic acid, and about 15% of methacrylic anhydride in diglyme is coated by spinning to provide a thickness of about 2 microns on a substrate of silicon oxide on silicon of about 3¼" diameter. Next, a layer of about 1 micron of a positive photoresist of m-cresol-formaldehyde novolak polymer containing about 20% by weight of a 2-diazo-1-napthoquinone-5-sulphonic acid ester is coated onto the layer of terpolymer from a solution in 2-ethoxy cellosolve acetate and n-butyl acetate in 9:1 ratio.

The structure is then imagewise exposed to near ultraviolet light of about 350 to about 450 nanometers and developed in an alkaline solution of about 0.2 normal KOH for about 50 seconds to remove those portions of the novolak resist which were exposed to the ultraviolet light.

Next, a polymethylmethacrylate resist layer is coated over the novolak resist by spin casting. The composite is then subjected to a hardening bake of about 180° C. for about 30 minutes to crosslink the novolak. The polymethylmethacrylate layer holds the novolak in place during the thermal crosslinking.

The composite is then exposed to deep U.V. radiation. The polymethylmethacrylate layer and the exposed portions of the terpolymer resist layer are then removed by use of a mixed solvent of methylethyl ketone and methylisobutyl ketone in a 1:4 ratio and 1% water, followed by rinsing with isopropyl alcohol and then deionized water, and drying in nitrogen.

Next, the portion of the terpolymer not surrounded by the novolak layer or silicon oxide substrate (e.g.—the sidewalls exposed during the imagewise exposure) is reacted by immersion in 3-aminopropyltriethoxy silane for about 40 minutes at room temperature to harden the surface layer of the terpolymer.

The structure is subjected to temperatures of at least about 220° C. for about 20 minutes. The resist layers maintained their form and did not reflow under these conditions.

COMPARISON EXAMPLE 2

Example 1 is repeated, except that the reaction with the 3-aminopropyltriethoxy silane is not carried out.

Subjecting this composite to the about 220° C. temperature for about 20 minutes results in significant distortion of the terpolymer resist layer.

Having thus described our invention, what we claim as new and desire to secure by Letters Patent is:

1. A patterned image comprising a substrate,
   a patterned image of a first resist polymeric material on said substrate wherein said polymeric material contains at least one of reactive hydrogen functional groups or reactive hydrogen precursor groups wherein at least the surface layer of the exposed and uncovered first resist polymeric material being reacted with a multifunctional organometallic material containing at least two functional groups that are reactive with the functional groups of said polymeric material;
   and a patterned image of a second and different resist material on said first resist polymeric material,
   and wherein said first resist polymeric material is intermediate said substrate and said second and different resist material.

2. The image of claim 1 wherein said organometallic material is an organosilicon material.

3. The image of claim 1 wherein said organometallic material if 3-aminopropyltriethoxy silane.

4. The image of claim 1 wherein said first resist is about 1 to about 4 microns thick.

5. The image of claim 4 wherein said second resist is about 0.5 to about 2 microns thick.

6. The image of claim 1 wherein about 100 to about 2000 angstroms into the surface layer of the first resist is reacted with said organometallic material.

7. The image of claim 1 wherein said first resist polymeric material is a terpolymer of methylmethacrylate, methacrylic acid and methacrylic anhydride.

8. The image of claim 7 wherein second resist is a phenolic formaldehyde positive or negative resist.

9. The image of claim 7 wherein said second resist is a cresol formaldehyde positive or negative resist.

10. The image of claim 1 wherein second resist is a phenolic formaldehyde positive or negative resist.

11. The image of claim 1 wherein said second resist is a cresol formaldehyde positive or negative resist.

12. The patterned image of claim 1 wherein the surface layer of only the uncovered side walls of said first resist polymeric material is reacted with said multifunctional organometallic material.

13. A method for providing an image which comprises:
   a. providing a first resist polymeric material on a substrate wherein said polymeric material contains at least one of reactive hydrogen functional groups or reactive hydrogen precursor groups;
   b. providing a second and different resist material on said first resist polymeric material with said first resist polymeric material being intermediate said second and different resist material and said substrate;

c. exposing said second and different resist material to imaging radiation and developing said second and different resist material, thereby providing a resist image mask;

d. exposing said first resist polymeric material to imaging radiation through the said resist image mask;

e. then developing said first resist polymeric material; and f. then reacting at least the surface layer of the exposed and uncovered first resist polymeric material with a multifunctional organometallic material containing at least two functional groups that are reactive with the functional groups of said polymeric material, wherein said second and different resist material is present at the time of the reacting in step f.

14. The method of claim 13 wherein said first resist polymeric material is about 1 to about 4 microns thick.

15. The method of claim 14 wherein said second resist is about 0.5 to about 2 microns thick.

16. The method of claim 13 wherein said first resist polymeric material is a terpolymer of methylmethacrylate, methacrylic acid and methacrylic anhydride.

17. The method of claim 16 wherein said second resist is a phenolic formaldehyde positive or negative resist.

18. The method of claim 16 wherein said second resist is a cresol-formaldehyde positive or negative resist.

19. The method of claim 13 wherein said second resist is a phenolic formaldehyde positive or negative resist.

20. The method of claim 13 wherein said second resist is a cresol-formaldehyde positive or negative resist.

21. The method of claim 13 wherein said organometallic material is an organosilicon material.

22. The method of claim 13 wherein said organometallic material is 3-aminopropyltriethoxy silane.

23. The method of claim 13 wherein about 100 to about 2000 angstroms into the surface layer of the first resist is reacted with said organometallic material.

24. The method of claim 13 wherein about 200 to about 1000 angstroms into the surface layer of the first resist is reacted with said organometallic material.

25. The method of claim 13 which further includes hardening said second and different resist material after developing such and prior to exposing the first resist to imaging radiation.

26. The method of claim 13 which further includes removing the first resist polymeric material from the substrate.

27. The method of claim 13 which further includes removing said second resist layer after step f.

28. The method of claim 13 which further includes retaining said second resist layer.

29. The method of claim 13 wherein the imaging radiation for said second and different resist material is in the mid to near U.V. ranges.

30. The method of claim 29 wherein the imaging radiation for said first resist polymeric material is in the deep U.V. range.

31. The method of claim 13 wherein the surface layer of only the uncovered side walls of said first resist polymeric material is reacted with said multifunctional organometallic material.

* * * * *

UNITED STATES PATENT AND TRADEMARK OFFICE
CERTIFICATE OF CORRECTION

PATENT NO. : 4,737,425

DATED : April 12, 1988

INVENTOR(S) : Lin, et al.

It is certified that error appears in the above-identified patent and that said Letters Patent is hereby corrected as shown below:

On the cover page, the line below [75], change "Jer-Mind" to -- Jer-Ming --.

Signed and Sealed this

Fifteenth Day of November, 1988

Attest:

DONALD J. QUIGG

*Attesting Officer*   *Commissioner of Patents and Trademarks*